United States Patent [19]

Hsia

[11] 4,063,267
[45] Dec. 13, 1977

[54] MNOS MEMORY DEVICE
[75] Inventor: Yukun Hsia, Saratoga, Calif.
[73] Assignee: McDonnell Douglas Corporation, Long Beach, Calif.
[21] Appl. No.: 698,437
[22] Filed: June 21, 1976
[51] Int. Cl.² ............................................. H01L 29/78
[52] U.S. Cl. .......................................... 357/23; 357/54
[58] Field of Search ........................... 357/23, 54, 41, ; 340/173 R

[56] References Cited
U.S. PATENT DOCUMENTS
3,846,768  11/1974  Krick ................................. 357/54 X OTHER PUBLICATIONS
P. J. Krick, "The Implanted Stepped-Oxide MNOS-FET," IEEE Transactions on Electron Devices, Feb. 1975, pp. 62–63.
Electronics, Apr. 1, 1976, p. 89.

Primary Examiner—Stanley D. Miller, Jr.
Assistant Examiner—James W. Davie
Attorney, Agent, or Firm—Townsend and Townsend

[57] ABSTRACT

A method for fabricating a variable threshold IGFET free of parasitic effects and the "floating gate" effect. The IGFET includes an oxide layer having a portion of minimum thickness in the region thereof overlying an interstitial portion of a semiconductive substrate having a pair of spaced semiconductive diffusion regions, a portion of intermediate thickness partially overlying at least one of the pair of diffusion regions and the interstitial substrate portion, and a remaining portion of maximum thickness. The oxide layer portion of minimum thickness has a width greater than the width of an overlying electrically conductive gate electrode; the oxide layer portion of intermediate thickness has a width less than the width of the overlying electrode.

16 Claims, 11 Drawing Figures

MNOS MEMORY DEVICE

BACKGROUND OF THE INVENTION

This invention relates to the field of non-volatile semiconductor memory devices. More particularly, this invention relates to an improved non-volatile semiconductor memory device of the insulated gate field effect transistor (IGFET) type and a method of fabricating same.

Non-volatile semiconductor memory devices are known which typically employ a large scale integration (LSI) array of individual non-volatile IGFET elements with suitable interconnections to function as a multibit storage device, such as a read only memory (ROM), a read mostly memory (RMM), an electronically alterable read only memory (EAROM), a random access memory (RAM) or the like. Each non-volatile IGFET element typically comprises a semiconductor substrate material of a first conductivity type, a pair of source and drain diffusion regions of opposite conductivity type from the substrate material and separated by an interstitial portion of the substrate material, an overlying dielectric oxide layer of minimum thickness in the region overlying the interstitial substrate portion, a layer of a different dielectric material over the oxide layer and a gate electrode metallization layer overlying the dielectric material. In addition, an ohmic contact is provided for each diffusion region so that supply voltages may be coupled thereto from suitable sources. The non-volatile IGFET element can be operated as a two-state memory device by virtue of the variable threshold switching property exhibited by devices of this type. In a conventional field effect transistor, the threshold voltage which must be applied between the gate and the source electrodes to cause current conduction between the drain and the source electrodes is fixed. In non-volatile IGFET devices, on the other hand, this threshold voltage can be altered by applying a relatively large potential difference between the gate electrode and the substrate. The threshold voltage may be altered back to an initial level by applying a relatively large potential difference of opposite polarity between the gate and the substrate. If the two different threshold voltages are well defined and of sufficiently different magnitude, a non-volatile IGFET may be operated as a bistable memory device by arbitrarily assigning one and zero values to the different threshold voltages, selectively altering the threshold voltage and subsequently interrogating the IGFET with a voltage whose magnitude lies between the two different threshold voltages while sensing the source-to-drain current. Circuits have been designed employing non-volatile IGFET as bistable memory elements, and several representative circuits are shown in U.S. Pat. No. 3,636,530.

Metal-nitride-oxide-silicon (MNOS) IGFET memory devices using silicon nitride as the dielectric element have been fabricated for use as bistable memory elements and, while MNOS implementation has many advantages, the performance of such devices has not been found to be entirely satisfactory. One of the chief reasons for the unsatisfactory performance to date of variable threshold IGFET memory devices is the lack of predictability of the two different threshold voltages noted above. In the ideal case, the gate voltage-drain current characteristic of the device would consist of a pair of highly linear curves with very steep slopes and separated by a sufficient range of voltage so that a range of gate voltages would exist which would cause the device to conduct heavily only if the device had been previously placed in the lower voltage threshold. Conventional prior art devices do not approach the ideal case, however, and exhibit parasitic effects which result in gate voltage-drain current characteristics which vary between individual elements on a LSI chip and also vary from chip to chip in an unpredictable manner. Due to this unpredictability, it is difficult to assign a priori a range of interrogating gate voltages which will result in conduction only when the MNOS device is in one of the two variable threshold states. Further, the nature of these parasitic gate voltage-drain current characteristics is such that in either state the device may conduct heavily by applying the same interrogating gate voltage of a given magnitude. Stated differently, interrogation of a prior art variable threshold IGFET device having parasitic characteristics with a gate voltage of a given magnitude does not cause the device to conduct heavily only in one state.

The apparent reason for this parasitic behavior of conventional devices appears to reside in the geometry required to produce an operable non-volatile IGFET device. As noted above, such a device has an overlying oxide layer of minimum thickness in the region overlying an interstitial exposed portion of the substrate material which separates the two different regions, with the oxide being covered by a layer of different dielectric material which in turn is covered by a metallization layer. The field oxide layer elsewhere has a substantially uniform thickness many orders of magnitude greater than the minimum thickness. Between the thick oxide region and the thin oxide region there exists a transition sometimes termed a "sidewalk" which functions as an MNOS device with gradually increasing oxide thickness. When the MNOS memory region is switched between high and low threshold voltages, this transition region is switched to a threshold voltage somewhere between the high and low values of the main memory region. Thus, when the main channel is set at high threshold voltage, this transition region may be conducting at voltages lying below the high threshold voltage. Schematically, the equivalent device would comprise a single MNOS memory element and two flanking MOS devices with the source, drain and gate elements coupled in parallel.

Many efforts have been made to solve this parasitic problem. One such attempt has been to broaden the gate region in a direction perpendicular to the line separating the diffusion regions so that the thin oxide gate region extends beyond the overlying gate electrode metallization layer. This solution introduces an additional problem due to the fringing electric field from the gate, termed the floating gate problem, in which charges tend to accummulate around the edge of the nitride insulation overlying the gate region, with the result that the device rapidly degenerates into a different type of parasitic device exhibiting substantially the same parasitic behavior as that noted above.

Another proposed solution has been the provision of a heavy ion implantation region in the gate region which extends beyond the edges of the overlying gate electrode metallization layer in the direction noted above. While this solution has been found to raise the threshold voltage of the regions adjacent the gate metallization layer beyond the high threshold voltage of the variable threshold IGFET device, the ion implantation step is relatively difficult to perform in a controlled manner and inordinately lengthens the manufacturing process. An alternate variation of this solution has been the provision of a pair of independent blocking diffusion regions extending beyond opposite edges of the gate electrode metallization layer in the direction noted above and also partially into the gate region. This alternate solution, however, suffers from the same limitations as those noted above in that it requires additional processing steps which increase the cost of manufacturing devices of this type. Accordingly, efforts to date to provide a variable threshold IGFET memory device in LSI form substantially free of the parasitic effects noted above have not met with wide success.

SUMMARY OF THE INVENTION

The invention comprises a method for fabricating a variable threshold IGFET free of parasitic effects and the article so produced.

The method proceeds by forming a semiconductive substrate of a first conductivity type material, forming a pair of laterally spaced diffusion regions of opposite conductivity type to the substrate material adjacent one surface of the substrate and forming a variable thickness oxide layer having a portion of minimum thickness with a predetermined width at least partially overlying the interstitial portion of the substrate, a portion of intermediate thickness substantially greater than the minimum thickness and partially overlying the interstitial substrate portion and at least one of the pair of spaced diffusion regions, and a remaining portion of maximum thickness substantially greater than the intermediate thickness. A layer of silicon nitride dielectric material is deposited to a predetermined thickness on the oxide layer, after which an electrically conductive electrode is formed on the dielectric layer in the region overlying the minimum thickness portion of the oxide layer to a width less than the width of the minimum thickness portion of the oxide layer. The IGFET is completed by forming ohmic contacts with the diffusion regions.

The minimum thickness portion of the oxide layer forms with the overlying portion of the dielectric layer and the underlying portion of the semiconductive substrate an insulative gate region, while the oxide layer portion of intermediate thickness forms with the underlying portion of the semiconductive substrate an MOS gate region.

The resulting variable threshold IGFET comprises a semiconductor memory element having a semiconductive substrate of a first conductivity type; a pair of spaced semiconductive diffusion regions formed in the substrate adjacent one surface thereof and separated by an interstitial portion; a layer of oxide material adhered to the common boundary surface with the layer having a portion of minimum thickness in the region thereof overlying the interstitial portion, a portion of intermediate thickness partially overlying at least one of the pair of diffusion regions and the interstitial substrate portion, and a remaining portion of maximum thickness; a layer of dielectric material adhered to the oxide layer; and an electrically conductive electrode of predetermined width adhered to the dielectric layer in the region overlying the interstitial substrate portion, with the oxide layer portion of minimum thickness having a width greater than the width of the electrically conductive electrode and the oxide layer portion of intermediate thickness having a width less than the width of the electrically conductive electrode. In an alternate embodiment, the oxide layer portion of intermediate thickness extends in opposite directions from the interstitial substrate portion and partially overlies both of the pair of diffusion regions and the interstitial substrate portion. In the preferred embodiments, the minimum thickness oxide portion is no greater than about 20 A units, the intermediate thickness portion of the oxide layer lies in the range from about 1200A to about 1600A and the remaining portion has a thickness of several thousand A. The dielectric layer has a thickness in the range from about 400A to about 800A and is preferably about 650A in thickness. The width of the oxide layer portion of minimum thickness is preferably no less than the width of the electrically conductive electrode plus the minimum achievable alignment tolerance length over the width of the electrically conductive electrode, while the width of the oxide layer portion of intermediate thickness is no greater than the width of the electrically conductive electrode less the same alignment tolerance.

For a fuller understanding of the nature and advantages of the invention, reference should be had to the ensuing detailed description taken in conjunction with the accompanying drawings.

DESCRIPTION OF THE PREFERRED EMBODIMENTS

Figure 1:
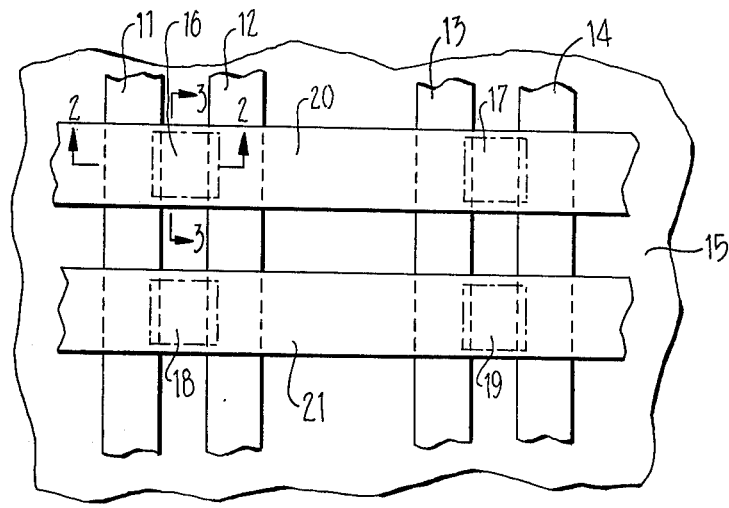
FIG. 1 is a schematic plan view of a conventional variable threshold IGFET memory array.

Turning now to the drawings, FIG. 1 is a schematic top plan view of a conventional multibit variable threshold IGFET memory array. For purposes of illustration, only four memory elements are shown; however, it is understood that in practice the memory array is fabricated with a substantially greater number of memory elements. As shown in FIG. 1, a plurality of diffusion channels 11-14 are formed in a substrate material 15, with the diffusion channels 11-14 being of opposite conductivity type to semiconductor substrate material 15.

Interspersed between adjacent channels 11, 12 and 13, 14 are a plurality of underlying regions 16-19 illustrated in phantom for illustrative purposes only. Overlying gate regions 16-19 and electrically isolated from diffusion channels 11-14 are a pair of metallization layers 20, 21 which form gate electrodes for the gate regions 16-19.

Figure 2:
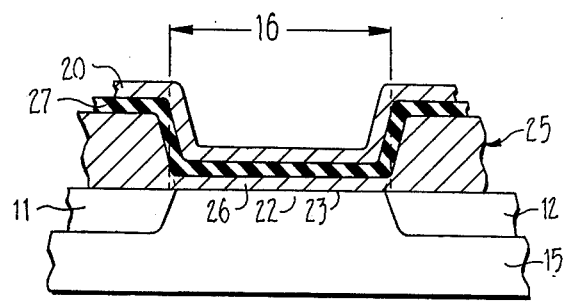
FIG. 2 is a sectional view taken along lines 2—2 of FIG. 1.

With reference to FIG. 2 each variable threshold IGFET comprises a composite structure including semiconductive substrate 15, and diffusion regions 11, 12 of opposite conductivity type to that of substrate 15 and serving as the source and drain, respectively, of the IGFET. Diffusion regions 11, 12 are separated by interstitial portion 22 of substrate 15, and elements 11, 12 and 22 share a common upper terminating surface 23. Adhered to surface 23 is layer of oxide material 25, typically silicon dioxide ($SiO_2$), having variable thickness as shown. The thickness of field oxide layer 25 is a minimum in the gate portion 26 over interstitial portion 22 of substrate 15 and this thickness ususally does not exceed 25A, although thicknesses of up to several hundred A are not unknown. The thickness of field oxide layer 25 increases to several thousand A in the region over the diffusion regions 11, 12 and this thickness is maintained between adjacent diffusion regions (not shown), e.g. between regions 12 and 13 of FIG. 1.

Overlying the oxide layer 25 is a dielectric layer usually composed of silicon nitride ($Si_3N_4$) typically formed to a thickness in the range from about 450 to about 850 A within a tolerance of ±50 A. Overlying dielectric layer 27 is the metallization layer 20 which is typically composed of aluminum.

Figure 3:
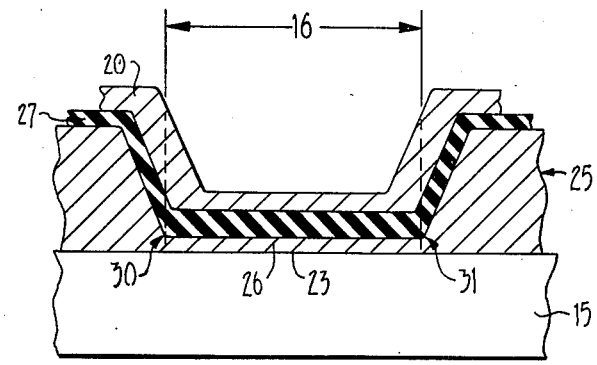
FIG. 3 is a sectional view taken along lines 3—3 of FIG. 1.

As best shown in FIG. 3, the minimum thickness portion 26 of oxide layer 25 defining the insulative gate region has a maximum width which is less than the width of metallization layer 20 and includes a pair of transition regions 30, 31 in which the thickness of the oxide layer gradually increases to the maximum dimension noted above.

Figure 4:
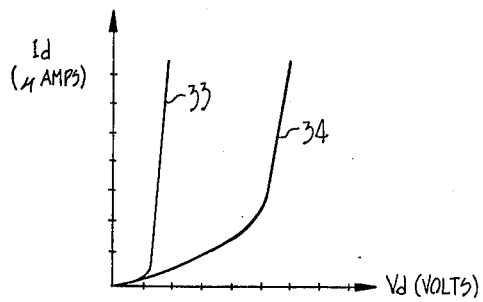
FIG. 4 is a transfer characteristic curve of the device of FIG. 1.

In use, when an electric field is applied across the gate portion 26 of layer 25, carriers (electrons or holes) tunnel through the thin gate portion 26 of oxide layer 25 and are trapped in the silicon nitride layer 27. Theoretically, this should produce a low or a high threshold voltage, depending on the polarity of the interface trapped charges. When the insulative gate region 16 is switched between high and low threshold voltages, however, transition regions 30, 31 are also switched to a threshold voltage lying somewhere between the high and low values of the insulative gate regions 16. Thus, when the insulative gate region 16 is at a high threshold voltage, transition regions 30, 31, sometimes termed the sidewalks, may be conducting at lower voltages than the threshold voltage. The resultant drain current voltage characteristic is illustrated in FIG. 4. As seen in this FIG., the prior art device exhibits a pair of characteristic curves 33, 34 corresponding to the low and high threshold voltage states, respectively. However, the curves are joined near the origin and are thus not single valued as desired. Accordingly, the device can conduct in either the low or high threshold potential state when an interrogating gate voltage is applied.

The sidewalk effect can be reduced by forming the transition regions 30, 31 with very steep sidewalls; however, in practice this technique is difficult to implement and has not been found to lead to highly predictable results. Another known method or reducing the sidewalk effect is to provide a pair of blocking diffusion regions in the area of transition regions 30, 31. This solution, however, is relatively undesirable since the density of the LSI chip (i.e. the number of elements which can be formed on a chip of given size) is substantially reduced. Another solution proposed in the past is the provision of a stepped oxide in the insulative gate region and ion implanted regions adjacent regions 30, 31 (see "The Implanted Stepped-Oxide MNOSFET" by Krick, IEEE Transactions On Electron Devices, February 1975, pages 62, 63). The drawback with this solution lies in the fact that a heavy ion implantation step is required which lengthens the processing time and thus the manufacturing cost.

Figure 5:
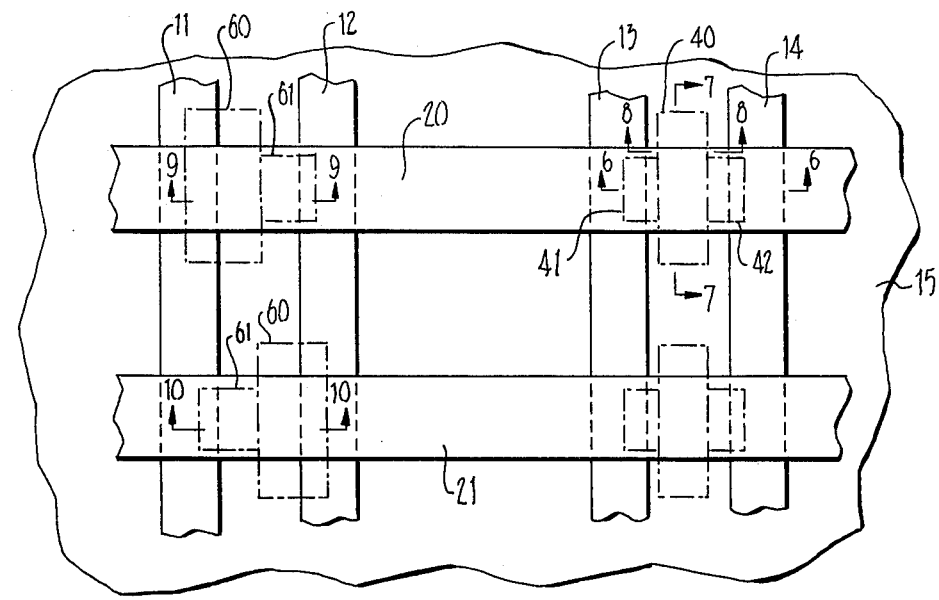
FIG. 5 is a schematic plan view of a variable threshold IGFET memory array illustrating several different embodiments of the invention.

FIG. 5 is a schematic top plan view illustrating several embodiments of variable threshold IGFETS fabricated in accordance with the invention. As seen in this FIG., a four-element memory array has diffusion channels 11-14 formed in a semiconductive substrate material 15, with the diffusion channels 11-14 being of opposite conductivity type to semiconductive substrate material 15. In addition, gate metallization layers 20, 21 are provided in a manner substantially identical to the prior art device of FIG. 1.

Figure 6:
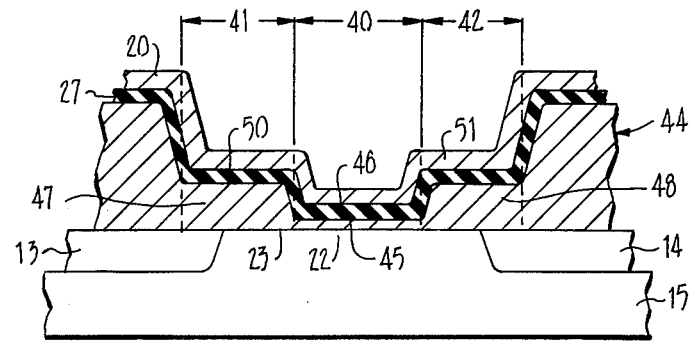
FIG. 6 is a sectional view taken along lines 6—6 of FIG. 5.
Figure 7:
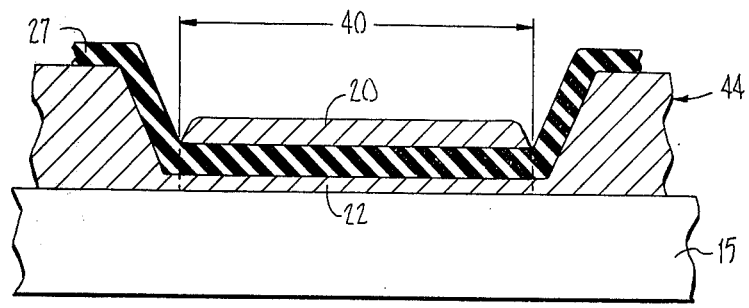
FIG. 7 is a sectional view taken along lines 7—7 of FIG. 5.
Figure 8:
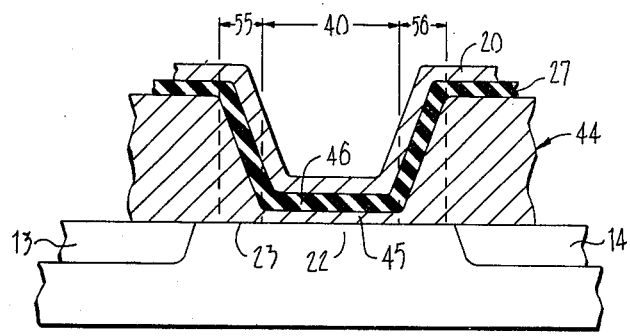
FIG. 8 is a sectional view taken along lines 8—8 of FIG. 5.

The preferred embodiment of the invention is illustrated to the right of FIG. 5 and is shown in cross-section in FIGS. 6 - 8.

As seen in these FIGS., the memory element includes a central gate region 40 which extends beyond the width of metallization layer 20 and a pair of flanking MOS gate regions 41, 42 which are narrower than the overlying metallization layer 20 and which extend from the edge of the central gate region 40 into the diffusion channel regions 13, 14. The central gate region 40 is defined by a minimum thickness region 45 of field oxide layer 44, the overlying portion 46 of dielectric layer 47 and a portion of the underlying interstitial region 22 of semiconductive substrate 15. As best shown in FIG. 7, this central gate region extends beyond the width of metallization layer 20 and thus eliminates the sidewalk regions found in the prior art structure.

The flanking gate regions 41, 42 are defined by regions 47, 48 of oxide layer 44 having an intermediate thickness, overlying portions 50, 51 of dielectric layer 27 and the underlying remaining interstitial portion 22 of substrate 15. Flanking gate regions 41, 42 function as a pair of MOS gates which isolate the central gate region from the diffusion channels 13, 14 and provide a high P-N junction breakdown voltage, and insure enhancement mode operation of the MNOS transistor.

With reference to FIG. 8, the oxide regions 55, 56 flanking the central gate region 40 near the corners of the junctions between region 45 and regions 47 and 48 provide channel regions possessing a relatively high threshold voltage. Regions 55, 56 each provide an interrupted channel which prevents the formation of a parasitic conductive path found in prior art devices and which is due to the fringe field depth effect, sometimes termed the "floating gate" effect.

Figure 9:
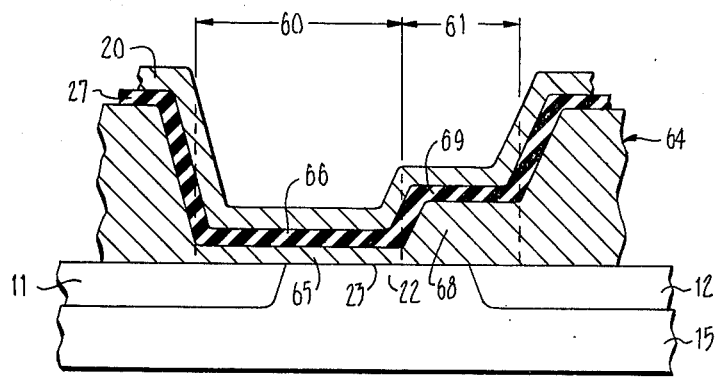
FIG. 9 is a sectional view taken along lines 9—9 of FIG. 5 showing an alternate embodiment of the invention.
Figure 10:
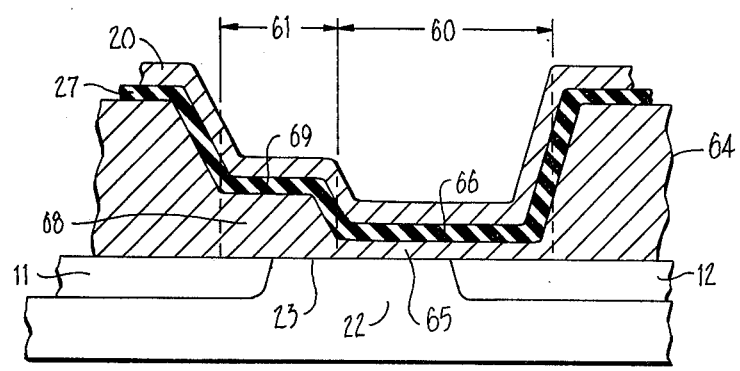
FIG. 10 is a sectional view taken along lines 10—10 of FIG. 5 showing another embodiment of the invention.

A pair of alternate embodiments of the invention are shown to the left of FIG. 5 and in section in FIGS. 9 and 10. The first alternate embodiment is shown in the upper left hand portion of FIG. 5 and in section in FIG. 9 and comprises an insulative gate region 60 and a single MOS gate 61 arranged side-by-side. With reference to FIG. 9, insulative gate region 60 is defined by a minimum thickness region 65 of field oxide layer 64, overlying portion 66 of dielectric layer 27, and a portion of the underlying interstitial region 22 of semiconductive substrate 15. The MOS gate region 61 is defined by an intermediate thickness 68 of field oxide layer 64, overlying portion 69 of dielectric layer 27 and the remaining underlying interstitial portion 22 of semiconductive substrate 15. Insulative gate region 60 has a width greater than metallization layer 20 to eliminate the sidewalk regions, while MOS region 61 has a width narrower than metallization layer 20 and extends from the edge of insulative gate 60 into the region of diffusion channel 12.

The second alternate embodiment of the invention is illustrated in the lower left hand portion of FIG. 5 and shown in section in FIG. 10 and is seen to comprise insulative gate region 60 and MOS gate 61 in reverse positions.

Figure 11:
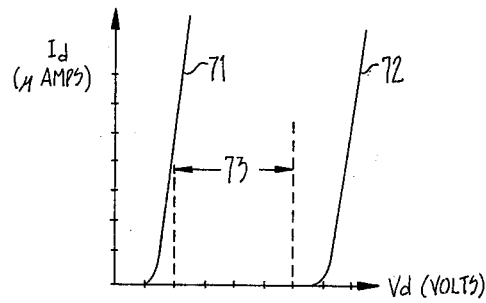
FIG. 11 is a transfer characteristic curve of the invention.

FIG. 11 shows the drain current-voltage characteristics of memory elements fabricated in accordance with the teachings of the invention. As seen in this FIG., the device exhibits two discrete single valued characteristic curves 71, 72 corresponding to the low and high threshold potential states, respectively. Thus, if the device is interrogated with a gate voltage lying in region 73 the element will only conduct heavily if it has been previously switched to the low threshold potential state. As is clearly demonstrated by the curves of FIG. 11, the parasitic effect is complete eliminated with the invention.

The MNOS IFGETs of FIG. 5 are preferably batch fabricated in accordance with the following process. A starting wafer of N type substrate material having known resistivity and crystal orientation is acid cleaned, rinsed in water and spray dried with dry nitrogen. An oxide layer (silicon dioxide) is thermally grown to provide a mask for diffusion of the source and drain P type regions. The P type regions are next formed by a conventional boron diffusion using the oxide layer as a mask.

The gate areas 40-42 or 60, 61 are next exposed by etching away the oxide mask after which a gate oxide layer of substantially 1400 A is thermally grown at a temperature of from about 950° C. to about 1000° C. The thin insulative gate area 40 to 60 is next etched out, and a thin layer of silicon dioxide is chemically grown to a thickness of from about 15 to about 20 A.

A dielectric layer 27 of silicon nitride is next formed by a chemical vapor deposition process. Preferably layer 27 is formed as a compound layer in accordance with the process disclosed in co-pending commonly assigned U.S. Pat. Appln. Ser. No. 633,879 filed Nov. 20, 1975 for "Non-Volatile Semiconductor Memory Device," the disclosure of which is hereby incorporated by reference.

The device is completed by etching away the nitride layer 27 over the diffusion channels 11-14 to expose the latter, and providing metallization contacts for the diffusion channels 11-14 (not shown) and for the insulative gate regions 49-42 or 60, 61, followed by a conventional low temperature vapor deposition to provide a passivation layer of silicon dioxide.

It should be noted that the metallization contacts for diffusion channels 11-14 are conventional and have been omitted from the FIGS. for clarity.

It should further be noted that the optimum range of thickness of dielectric layer 27 is from about 450 A to about 850 A ±50 A, with a preferred thickness of about 650 A ± 50 A. The thickness of each layer can be controlled using conventional techniques for timing the deposition period for each layer, which include published deposition rates for various silane concentrations and ammonia concentrations.

The optimum range of thickness of intermediate thickness portions 47, 48 and 68 of field oxide layers 44 and 64, respectively is from about 1200A to about 1600A units, with a preferred thickness of about 1400A. Insulative gate regions 40, 60 should have a sufficient width to extend the sidewalk regions well beyond the boundaries of the metallization layers 20, 21. Excellent results have been obtained with insulative gates 40, 60 having a width which exceeds the width of metallization layers 20, 21 by a value of about one tolerance length (four microns) on each side. MOS gate regions 41, 42 and 61 should have a width less than the width of metallization layers 20, 21. Excellent results have been obtained with MOS gate regions 41, 42 and 61 having a width which is smaller than the width of metallization layers 20, 21 by a value of about one tolerance length (four microns) on each side. MOS gate regions 41, 42 and 61 should also have sufficient length to isolate the associated insulative gate region 40 or 60 from the diffusion channel to which the MOS gate region is associated. Excellent results have been obtained with a separation distance of about one alignment tolerance length (four microns) between the edge of an insulative gate 40 and the edge of diffusion channels 13, 14.

While not illustrated, it should be noted that the minimum thickness oxide region 45 and the overlying portion 46 of dielectric layer 27 need not be interrupted in the area between adjacent devices, but may extend continuously as a single channel common to all devices in a given column on the substrate wafer.

As will now be apparent, variable threshold IGFETS fabricated in accordance with the teachings of the invention exhibit extremely stable Id-Vd characteristics without parasitic effects. Further, excellent yields have been obtained using the method of the invention. In addition, the electrical characteristics of devices fabricated in accordance with the teachings of the invention have been found to be extremely reproducible from batch to batch. Moreover, no additional processing steps are required to fabricate the invention, and the device density is substantially identical to prior art structures.

There are many uses to which the invention may be applied. These applictions include non-volatile shift registers for bulk storage, high speed read mostly memories and random access read/write memories. All applications utilize the desirable properties of MNOS technology, viz.(a) non-volatile storage capability which requires no standby power and reduces overall power requirements for semiconductor memory storage, (b) nondestructive high speed read out for applications requiring a simple read access of stored information, (c) high element density per LSI wafer and (d) compatibility with MOS logic elements on the same chip.

While the above provides a full and complete disclosure of the preferred embodiments of the invention, various modifications, alternate constructions and equivalents may be employed without departing from the true spirit and scope of the invention. For example, the principles of the invention may be equally applied to semiconductive variable threshold devices utilizing a poly-silicon gate or a P-type substrate and N-type diffusion channels, or the metal-aluminum-oxide-silicon (MAOS) devices. Therefore the above description and illustrations should not be construed as limiting the scope of the invention which is defined by the appended claims.

What is claimed is:

1. An insulative gate field effect transistor comprising:

a semiconductive substrate of a first conductivity type;

a pair of spaced semiconductive diffusion regions of opposite conductivity type to said substrate formed in said substrate, said diffusion regions being separated by an interstitial portion of said substrate and sharing a common boundary surface therewith;

a layer of oxide material adhered to said common boundary surface, said layer having a portion of minimum thickness in the region thereof overlying said interstitial portion of said substrate, a portion of intermediate thickness partially overlying at least one of said pair of diffusion regions and said interstitial portion of said substrate, and a remaining portion of maximum thickness;

a layer of dielectric material adhered to said oxide layer; and an electrically conductive electrode of predetermined width adhered to said dielectric layer in the region overlying said interstitial substrate portion;

said oxide layer portion of minimum thickness having a width greater than the width of said electrically conductive electrode to define with the overlying portion of said dielectric layer and the underlying portion of said semiconductive substrate an insulative gate region;

said oxide layer portion of intermediate thickness having a width less than the width of said electrically conductive electrode to define with the underlying portion of said semiconductive substrate an MOS gate region.

2. The combination of claim 1 wherein said oxide layer portion of intermediate thickness extends in opposite directions from said interstitial substrate portion and partially overlies both of said pair of diffusion regions and said interstitial substrate portion.

3. The combination of claim 1 wherein said first and said opposite conductivity types are N and P types, respectively.

4. The combination of claim 1 wherein said oxide material comprises silicon dioxide.

5. The combination of claim 1 wherein said minimum thickness of said oxide layer is about 20A.

6. The combination of claim 1 wherein said minimum thickness of said oxide layer is in the range from 10A to about several hundred A.

7. The combination of claim 1 wherein said intermediate thickness of said oxide layer is about 1400A.

8. The combination of claim 1 wherein said dielectric material comprises silicon nitride.

9. The combination of claim 1 wherein said dielectric layer has a thickness in the range from about 400A to about 800A.

10. The combination of claim 1 wherein said dielectric layer has a thickness of about 650A units.

11. The combination of claim 1 wherein the width of said oxide layer portion of minimum thickness is greater than the width of said electrically conductive electrode by one minimum alignment tolerance length on each side thereof.

12. The combination of claim 11 wherein said minimum alignment tolerance length is about four microns.

13. The combinations of claim 1 wherein said oxide layer portion of minimum thickness is no closer to said at least one of said pair of diffusion regions than one minimum alignment tolerance length.

14. The combination of claim 13 wherein said minimum alignment tolerance length is about four microns.

15. The combination of claim 1 wherein said oxide layer portion of intermediate thickness is smaller than the width of said electrically conductive electrode by one minimum alignment tolerance length on each side thereof.

16. The combination of claim 15 wherein said minimum alignment tolerance length is about four microns.

* * * * *